United States Patent
Pan et al.

(10) Patent No.: US 7,709,540 B2
(45) Date of Patent: May 4, 2010

(54) METHOD FOR PREPARING ORGANIC LIGAND-CAPPED TITANIUM DIOXIDE NANOCRYSTALS

(75) Inventors: Daocheng Pan, Changchun (CN); Nana Zhao, Changchun (CN); Qiang Wang, Changchun (CN); Xiangling Ji, Changchun (CN); Shichun Jiang, Changchun (CN); Lijia An, Changchun (CN)

(73) Assignee: Changchun Institute of Applied Chemistry Chines Academy of Sciences, Changchun, Jilin Province (CN)

( * ) Notice: Subject to any disclaimer, the term of this patent is extended or adjusted under 35 U.S.C. 154(b) by 452 days.

(21) Appl. No.: 11/293,694

(22) Filed: Dec. 2, 2005

(65) Prior Publication Data

US 2006/0188431 A1    Aug. 24, 2006

(30) Foreign Application Priority Data

Dec. 3, 2004    (CN)    ............ 2004 1 0011301

(51) Int. Cl.
*B01F 3/08* (2006.01)
*C09K 3/00* (2006.01)
*C01G 23/047* (2006.01)
*B01F 3/04* (2006.01)
*C30B 7/00* (2006.01)
*C30B 21/02* (2006.01)
*C30B 28/06* (2006.01)
*C23C 16/40* (2006.01)

(52) U.S. Cl. ............ 516/33; 423/610; 423/611; 423/612; 977/773; 516/22; 117/70; 117/71; 106/287.19

(58) Field of Classification Search ............ 423/608, 423/610–616; 977/734, 773, 775, 776, 811, 977/823, 840, 882, 883, 900; 516/33, 22; 117/70, 71; 106/287.19, 447
See application file for complete search history.

(56) References Cited

U.S. PATENT DOCUMENTS 5,718,878 A * 2/1998 Zhang .................. 423/610

(Continued)

OTHER PUBLICATIONS

Cozzoli et al. "Low-Temperature Synthesis of Soluble and Processable Organic-Capped Anatase TiO2 Nanorods," Journal of the American Chemical Society, 2003, 125, 14539-14548.*

(Continued)

*Primary Examiner*—Steven Bos
*Assistant Examiner*—Anthony J Zimmer
(74) *Attorney, Agent, or Firm*—Knobbe, Martens, Olson & Bear, LLP

(57) ABSTRACT

The present invention belongs to a method for preparing organic ligand-capped titanium dioxide nanocrystals, wherein the method comprises steps of using methyl titanate, ethyl titanate, n-propyl titanate, iso-propyl titanate, butyl titanate or titanium tetrachloride as a titanium source, and with capping by oleic acid or an organic capping agent, reacting the titanium source in an organic non-polar solvent with an aqueous alkaline substance solution in the interface at a temperature of 25 to 280° C. for 0.5 to 240 hrs, thus a transparent sol containing titanium dioxide nanocrystals is obtained, said the titanium dioxide nanocrystals have particle diameters of 1-20 nm. The preparing process has the features of mild reaction conditions and is a simpler and easier method with a shorter preparation period, thereby facilitating the industrialization.

3 Claims, 6 Drawing Sheets

U.S. PATENT DOCUMENTS

| | | | |
|---|---|---|---|
| 6,328,947 B1 * | 12/2001 | Monden et al. | 423/611 |
| 6,846,565 B2 * | 1/2005 | Korgel et al. | 428/402 |
| 6,911,082 B2 * | 6/2005 | Sato et al. | 117/68 |
| 6,962,946 B2 * | 11/2005 | Brady et al. | 516/90 |
| 2003/0003300 A1 * | 1/2003 | Korgel et al. | 428/402 |
| 2003/0165680 A1 * | 9/2003 | Brady et al. | 428/402 |
| 2005/0013766 A1 * | 1/2005 | Imura et al. | 423/610 |
| 2008/0003159 A1 * | 1/2008 | Cheon et al. | 423/263 |

OTHER PUBLICATIONS

Wu et al. "Preparation and Characterization of Stearate-Capped Titanium Dioxide Nanoparticles," Journal of Colloid and Interface Science 222, 37-40 (2000).*

Petrella et al. "TiO2 nanocrystals—MEH-PPV composite thin films as photoactive material," Thin Solid Films 451-452 (2004) 64-68.*

Comparelli et al. "Photocatalytic degradation of azo dyes by organic-capped anatase TiO2 nanocrystals immobilized onto substrates", Applied Catalysis B: Environmental 55 (2005) 81-91. Published Online Sep. 12, 2004.*

Zhang et al. "Aminolysis Route to Monodisperse Titania Nanorods with Tunable Aspect Ratio," Agnew. Chem. Int. Ed. 2005, 44, 3466-3470. Published online Apr. 25, 2005.*

Manera et al. "Investigation on alcohol vapours/TiO2 nanocrystal thin films interaction by spr technique for sensing application," Sensors and Actuators B 100 (2004) 75-80. Published online: Feb. 21, 2004.*

Prasad, Paras N. "Growth and Characterization of Nanomaterials," Nanophotonics. John Wiley & Sons Inc. Published Online: Aug. 26, 2004.*

Cozzoli et al. "Photocatalytic activity of organic-capped anatase TiO2 nanocrystals in homogenous organic solutions," Materials Science and Engineering C 23 (2003) 707-713.*

Pan et al. "Facile Synthesis and Characterization of Liminescent TiO2 Nanocrystals," Advanced Materials 2005, 17, 1991-1995, Published Online Jun. 30, 2005.*

Cheng, H. et al. (1995) "Hydrothermal preparation of uniform nanosize rutile and anatase particles" *Chem. Mater.* 7:663-671.

Hoyer, P. (1996) "Formation of a titanium dioxide nanotube array" *Langmuir* 12:1411-1413.

Martin, C.R. (1994) "Nanomaterials: a membrane-based synthetic approach" *Science* 266:1961-1966.

Matsui, K. et al. (2002) "Hydrothermal synthesis of single-crystal Ni(OH)2 nanorods in a carbon-coated anodic alumina film" *Adv. Mater.* 14:1216-1219.

Ovenstone, J. et al. (1999) "Effect of hydrothermal treatment of amorphous titania on the phase change from anatase to rutile during calcination" *Chem. Mater.* 11:2770-2774.

Wu, M. et al. (2002) "Sol-hydrothermal synthesis and hydrothermally structural evolution of nanocrystal titanium dioxide" *Chem. Mater.* 14:1974-1980.

\* cited by examiner

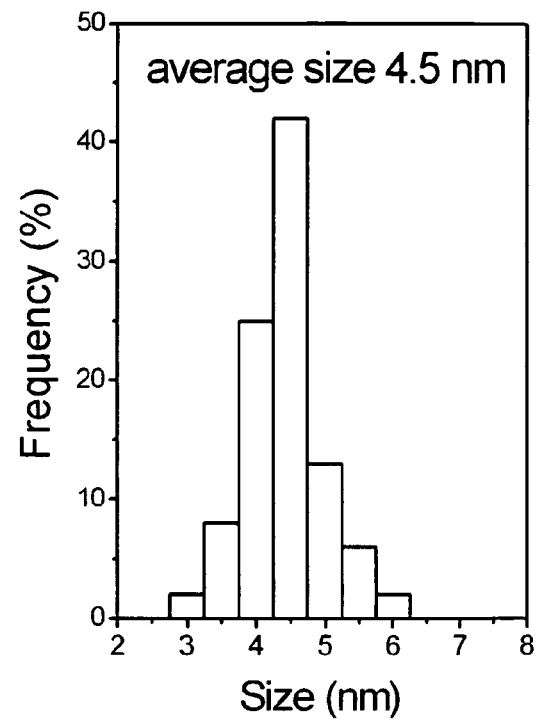
Fig. 1A                                    Fig. 1B

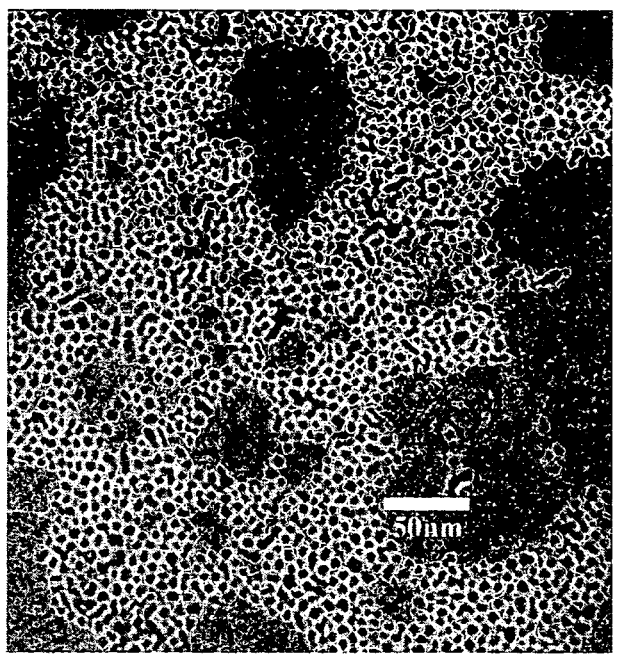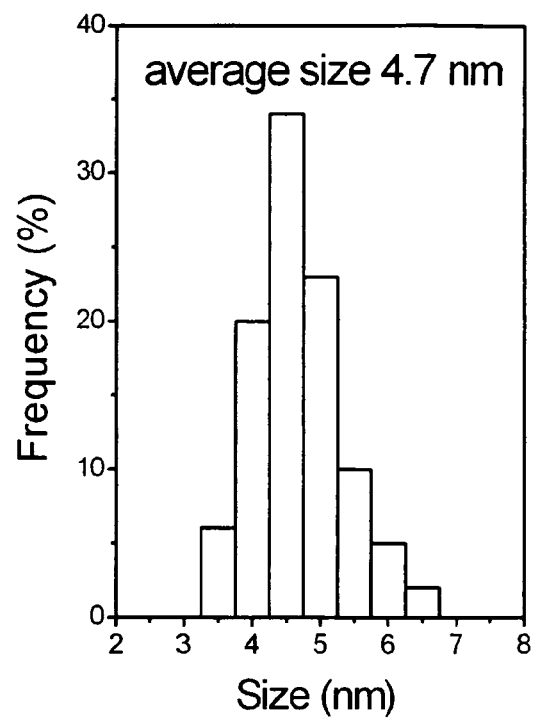
Fig. 2A
Fig2B

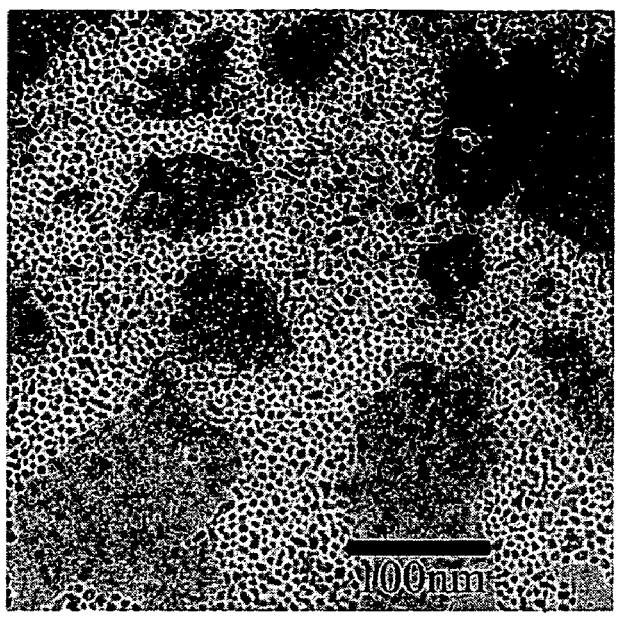
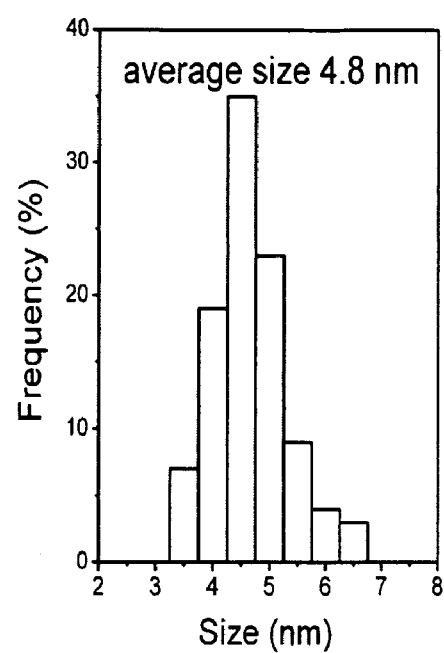
Figure 6A
Figure 6B

METHOD FOR PREPARING ORGANIC LIGAND-CAPPED TITANIUM DIOXIDE NANOCRYSTALS

CROSS-REFERENCE TO RELATED APPLICATIONS

This application claims the benefit of priority of Chinese patent application No.: 200410011301.0, filed Dec. 3, 2004.

FIELD OF THE INVENTION

The present invention relates to a method for preparing titanium dioxide nanocrystals, more particularly a method for preparing organic ligand-capped titanium dioxide nanocrystals.

BACKGROUND OF THE INVENTION

Titanium dioxide nano-material is a hotspot in the research of material science over the past three decades. Titanium dioxide nanocrystal is an oxide which has been most intensively studied, because they are widely applied in photocatalysis, sensors, solar cell, mesoporous film and the like. In addition, the titanium dioxide nanomaterial due to its feature in the nano-scale tends to complex with an organic material having a high or low molecular weight to manufacture a device such as a solar cell by a method such as spin coating and the like. The titanium dioxide nanocrystals exhibit a very attractive prospect in photovoltaic conversion. Therefore, the methods for preparing titanium dioxide nanocrystals have been intensively studied.

Heretofore, various methods have been used to prepare titanium dioxide nanocrystals, including hydrothermal method (*Chem. Mater.* 1995, 7, 663; *Chem. Mater.* 1999, 11, 2770; *Chem. Mater.* 2002, 14, 1974), and sol-gel method (*Science*, 1994, 266, 1961; *Langmuir*, 1996, 12, 1411; *Adv. Mater.* 2002, 14, 1216). In general, the titanium dioxide nanocrystals prepared by above two methods have a larger particle diameter, and those nanocrystals with a diameter less than 10 nm can hardly be produced. The resulting titanium dioxide nanocrystals can not be dispersed uniformly in an organic solvent and exhibit a broad size distribution.

SUMMARY OF THE INVENTION

One object of the present invention is to solve the problems existing in the prior art, and to provide a method for preparing a titanium dioxide sample which has a small size, narrow size distribution and is capable of being dispersed stably in a non-polar solvent.

As a result of intensive research by the present inventors, it is found that the object of the present invention can be achieved by a two-phase method; thereby the present invention is completed.

Thus, the present invention provides a method for preparing an organic ligand-capped titanium dioxide nanocrystal, wherein the method comprises steps of:

1) mixing a titanium source, an organic capping agent and an organic non-polar solvent, wherein the molar ratio of the organic capping agent:the titanium source:the organic non-polar solvent is 1000-1:1-10:1-10000; and 2) adding an aqueous alkaline substance solution into the mixture, wherein the molar ratio of the titanium source to the alkaline substance is 100-1:1-100, and the mixture reacts at a temperature of 25 to 280° C. under a pressure of normal pressure to 50 MPa for 0.5 to 240 hrs, thus a transparent sol containing the titanium dioxide nanocrystals is obtained, wherein said titanium source is a $C_1$-$C_4$ alkyl titanate.

According to one aspect of the present invention, said organic capping agent is selected from trioctyl phosphine oxide or a $C_8$-$C_{18}$ organic carboxylic acid. Preferably, said organic capping agent is selected from oleic acid, tri-n-octyl phosphine oxide, decanoic acid, dodecanoic acid, tetradecanoic acid, hexadecanoic acid, octodecanoic acid or n-octanoic acid.

According to another aspect of the present invention, said $C_1$-$C_{10}$ alkyl titanate is selected from methyl titanate, ethyl titanate, n-propyl titanate, iso-propyl titanate or butyl titanate.

According to still another aspect of the present invention, said alkaline substance is selected from ammonium hydroxide, trimethylamine, triethylamine, tripropylamine, t-butylamine, tetramethyl ammonium hydroxide, tetraethyl ammonium hydroxide, tetra-iso-propyl ammonium hydroxide, tetrabutyl ammonium hydroxide, trimethylamine oxide, triethylamine oxide, tripropylamine oxide, tributylamine oxide, sodium hydroxide or potassium hydroxide.

According to another aspect of the present invention, said organic non-polar solvent is selected from benzene, toluene, xylene, n-hexane or n-heptane.

According to still another aspect of the present invention, the concentration of said alkaline substance is 0.0001M-1M.

According to another aspect of the present invention, the particle diameters of said titanium dioxide nanocrystals are 1-20 nm.

With the advantage of two-phase preparing method of the present invention, a solution of titanium source in an organic non-polar solvent is reacted with an aqueous alkaline substance solution under an ambient pressure or a high pressure, titanium dioxide nanocrystals form nuclei and grow at the interface, while they are capped with the organic capping agent. The resultant titanium dioxide nanocrystals can be dispersed stably in an organic non-polar solvent. On one hand, the defects of a traditional single phase preparing method such as high reaction temperature, long reaction time, and difficulties in preparing titanium dioxide nanocrystals with small sizes have been overcome, meanwhile the nanoparticles prepared by the method of the present invention exhibit a narrow size distribution, and can be dispersed stably in an organic non-polar solvent. On the other hand, the sizes of titanium dioxide nanocrystals are controlled effectively.

The titanium dioxide nanocrystals prepared by the method according to the present invention have small particle diameters, narrow size distribution, and can be dispersed stably in a non-polar solvent, thereby it solves the problem that titanium dioxide nanocrystals are difficult to processing during its application. The whole preparing process of the material has the features of mild reaction conditions and is a simpler and easier method, and has a short preparation period, thereby facilitating the industrialization.

BRIEF DESCRIPTION OF THE DRAWINGS

FIG. 1A is a TEM image of oleic acid (OA)-capped $TiO_2$ nanocrystals prepared in Example 1.

FIG. 1B is the corresponding size distribution diagram of oleic acid-capped $TiO_2$ nanocrystals prepared in Example 1.

FIG. 2A is a TEM image of stearic acid (SA)-capped $TiO_2$ nanocrystals prepared in Example 11.

FIG. 2B is the corresponding size distribution diagram of stearic acid-capped $TiO_2$ nanocrystals prepared in Example 11.

FIG. 6A is a TEM image of stearic acid-capped $TiO_2$ nanocrystals prepared in Example 11.

FIG. 6B is the corresponding size distribution diagram of stearic acid-capped $TiO_2$ nanocrystals prepared in Example 11.

DETAILED DESCRIPTION OF THE PREFERRED EMBODIMENT

Figure 3A:
FIG. 3A is a TEM image of stearic acid-capped $TiO_2$ nanocrystals prepared in Example 12.

The present invention will be set forth with reference to examples below.

Example 1

Preparation of Oleic Acid-Capped Titanium Dioxide Nanocrystals 0.340 g (1 mmol) of butyl titanate, 5.0 mL of oleic acid and 15 mL of toluene were added into a 30 mL autoclave lined by polytetrafluoroethylene, and then 5.0 mL of an aqueous solution containing 35 mg (1 mmol) of ammonium hydroxide was added to this system. The autoclave was sealed, placed into a furnace and heated at 160° C. for 5 hrs. After being cooled, pale green titanium dioxide nanocrystals were formed in the oil phase. The average particle diameter thereof was about 4.5 nm measured by a transmission electron microscope. The TEM image and particle diameter distribution diagram thereof were shown in FIGS. 1A and 1B.

Example 2

Preparation of Oleic Acid-Capped Titanium Dioxide Nanocrystals 0.172 g (0.6 mmol) of methyl titanate, 0.5 mL of oleic acid and 10 mL of toluene were added into a 30 mL autoclave lined by polytetrafluoroethylene, and then 15 mL of an aqueous solution containing 18.3 mg (0.1 mmol) of tributyl amine was added to this system. The autoclave was sealed, placed into a furnace and heated at 120° C. for 24 hrs. After being cooled, pale green titanium dioxide nanocrystals were formed in the oil phase. The average particle diameter thereof was 10 nm.

Example 3

Preparation of Oleic Acid-Capped Titanium Dioxide Nanocrystals 0.284 g (1 mmol) of propyl titanate, 1.0 mL of oleic acid and 10 mL of benzene were added into a 30 mL autoclave lined by polytetrafluoroethylene, and then 10 mL of an aqueous solution containing 59 mg (1 mmol) of trimethylamine was added to this system. The autoclave was sealed, placed into a furnace and heated at 180° C. for 12 hrs. After being cooled, pale green titanium dioxide nanocrystals were formed in the oil phase. The average particle diameter thereof was about 6 nm.

Example 4

Preparation of Trioctyl Phosphine Oxide-Capped Titanium Dioxide Nanocrystals 0.228 g (1 mmol) of ethyl titanate, 1.0 g of trioctyl phosphine oxide and 5 mL of toluene were added into a 30 mL autoclave lined by polytetrafluoroethylene, and then 20 mL of an aqueous solution containing 7.5 mg (0.1 mmol) of trimethylamine oxide was added to this system. The autoclave was sealed, placed into a furnace and heated at 280° C. for 48 hrs. After being cooled, pale green titanium dioxide nanocrystals were formed in the oil phase. The average particle diameter thereof was about 20 nm.

Example 5

Preparation of Oleic Acid-Capped Titanium Dioxide Nanocrystals 0.228 g (1 mmol) of ethyl titanate, 1.0 mL of oleic acid and 10 mL of toluene were added into a 100 mL three necked flask, and heated at 100° C. until the solution became transparent and colorless. Thereafter, 10 mL of an aqueous solution containing 1.0 g (10 mmol) of triethylamine was added quickly into the flask with stirring, and the reaction flask was heated at 100° C. for 2 hrs. After being cooled, pale green titanium dioxide nanocrystals were formed in the oil phase. The average particle diameter thereof was about 8 nm.

Example 6

Preparation of Oleic Acid-Capped Titanium Dioxide Nanocrystals 0.284 g (1 mmol) of iso-propyl titanate, 0.1 mL of oleic acid and 10 mL of toluene were added into a 100 mL three necked flask, and heated at 100° C. until the solution became transparent and colorless. Thereafter, 2 mL of an aqueous solution containing 1.29 g (5 mmol) of tetrabutyl ammonium hydroxide was added quickly into the flask with stirring, and the reaction flask was heated at 60° C. for 4 hrs. After being cooled, pale green titanium dioxide nanocrystals were formed in the oil phase. The average particle diameter thereof was about 15 nm.

Example 7

Preparation of Oleic Acid-Capped Titanium Dioxide Nanocrystals 2.84 g (10 mmol) of iso-propyl titanate, 0.1 mL of oleic acid and 10 mL of n-hexane were added into a 100 mL three necked flask, and heated at 25° C. until the solution became transparent and colorless. Thereafter, 2 mL of an aqueous solution containing 0.1 g (0.5 mmol) of tributylamine oxide was added quickly into the flask with stirring, and the reaction flask was heated at 25° C. for 240 hrs. After being cooled, pale green titanium dioxide nanocrystals were formed in the oil phase. The average particle diameter thereof was about 8 nm.

Example 8

Preparation of Trioctyl Phosphine Oxide-Capped Titanium Dioxide Nanocrystals 0.190 g (1 mmol) of titanium tetrachloride, 1.0 g of trioctyl phosphine oxide and 5 mL of toluene were added into a 30 mL autoclave lined by polytetrafluoroethylene, and then 20 mL of an aqueous solution containing 3.75 mg (50 mmol) of triethylamine oxide was added to this system. The autoclave was sealed, placed into a furnace and heated at 280° C. for 48 hrs. After being cooled, pale green titanium dioxide nanocrystals were formed in the oil phase. The average particle diameter thereof was about 20 nm.

Example 9

Preparation of Trioctyl Phosphine Oxide-Capped Titanium Dioxide Nanocrystals 0.284 g (1 mmol) of iso-propyl titanate, 1.0 g of trioctyl phosphine oxide and 5 mL of toluene were added into a 30 mL autoclave lined by polytetrafluoroethylene, and then 15 mL of an aqueous solution containing 15.9 mg (0.1 mmol) of tripropylamine oxide was added to this system. The autoclave was sealed, placed into a furnace and heated at 280° C. for 240 hrs. After being cooled, pale green titanium dioxide nanocrystals were formed in the oil phase. The average particle diameter thereof was about 5 nm.

Example 10

Preparation of Trioctyl Phosphine Oxide-Capped Titanium Dioxide Nanocrystals 0.284 g (1 mmol) of iso-propyl titanate, 1.0 g of trioctyl phosphine oxide and 15 mL of toluene were added into a 30 mL autoclave lined by polytetrafluoroethylene, and then 5 mL of an aqueous solution containing 10.1 mg (0.05 mmol) of tributylamine oxide was added to this system. The autoclave was sealed, placed into a furnace and heated at 280° C. for 240 hrs. After being cooled, pale green titanium dioxide nanocrystals were formed in the oil phase. The average particle diameter thereof was about 5 nm.

Example 11

Preparation of Stearic Acid-Capped Titanium Dioxide Nanocrystals 0.284 g (1 mmol) of iso-propyl titanate, 0.5 g of stearic acid and 20 mL of toluene were added into a 30 mL autoclave lined by polytetrafluoroethylene, and then 5 mL of an aqueous solution containing 73 mg (1 mmol) of t-butylamine was added to this system. The autoclave was sealed, placed into a furnace and heated at 120° C. for 12 hrs. After being cooled, pale green titanium dioxide nanocrystals were formed in the oil phase. The average particle diameter thereof was about 4.7 nm. The transmission electron microscope image and the particle diameter distribution diagram thereof were shown in FIGS. 2A and 2B.

Example 12

Figure 3B:
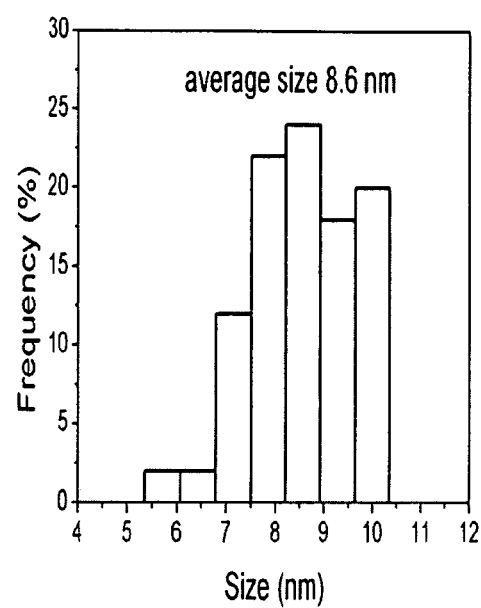
FIG. 3B is the corresponding size distribution diagram of stearic acid-capped $TiO_2$ nanocrystals prepared in Example 12.

Preparation of Stearic Acid-Capped Titanium Dioxide Nanocrystals 0.284 g (1 mmol) of iso-propyl titanate, 0.5 g of stearic acid and 10 mL of xylene were added into a 30 mL autoclave lined by polytetrafluoroethylene, and then 10 mL of an aqueous solution containing 0.91 g (5 mmol) of tetramethyl ammonium hydroxide was added to this system. The autoclave was sealed, placed into a furnace and heated at 180° C. for 5 hrs. After being cooled, pale green titanium dioxide nanocrystals were formed in the oil phase. The average particle diameter thereof was about 8.6 nm. The transmission electron microscope image and the particle diameter distribution diagram thereof were shown in FIGS. 3A and 3B.

Example 13

Preparation of Oleic Acid-Capped Titanium Dioxide Nanocrystals 0.284 g (1 mmol) of iso-propyl titanate, 0.1 mL of oleic acid and 10 mL of n-heptane were added into a 30 mL autoclave lined by polytetrafluoroethylene, and then 10 mL of an aqueous solution containing 7.4 mg (0.05 mmol) of tetraethyl ammonium hydroxide was added to this system. The autoclave was sealed, placed into a furnace and heated at 180° C. for 0.5 hrs. After being cooled, pale green titanium dioxide nanocrystals were formed in the oil phase. The average particle diameter thereof was about 3 nm.

Example 14

Preparation of Dodecanoic Acid-Capped Titanium Dioxide Nanocrystals 0.228 g (1 mmol) of ethyl titanate, 0.5 g of dodecanoic acid and 10 mL of toluene were added into a 30 mL autoclave lined by polytetrafluoroethylene, and then 2 mL of an aqueous solution containing 2 mg (0.01 mmol) of tetra-iso-propyl ammonium hydroxide was added to this system. The autoclave was sealed, placed into a furnace and heated at 100° C. for 120 hrs. After being cooled, pale green titanium dioxide nanocrystals were formed in the oil phase. The average particle diameter thereof was about 18 nm.

Example 15

Preparation of Octadecanoic Acid-Capped Titanium Dioxide Nanocrystals 0.228 g (1 mmol) of ethyl titanate, 1.0 g of octadecanoic acid and 5 mL of toluene were added into a 30 mL autoclave lined by polytetrafluoroethylene, and then 20 mL of an aqueous solution containing 40 mg (1 mmol) of sodium hydroxide was added to this system. The autoclave was sealed, placed into a furnace and heated at 100° C. for 120 hrs. After being cooled, pale green titanium dioxide nanocrystals were formed in the oil phase. The average particle diameter thereof was about 20 nm.

Figure 4:
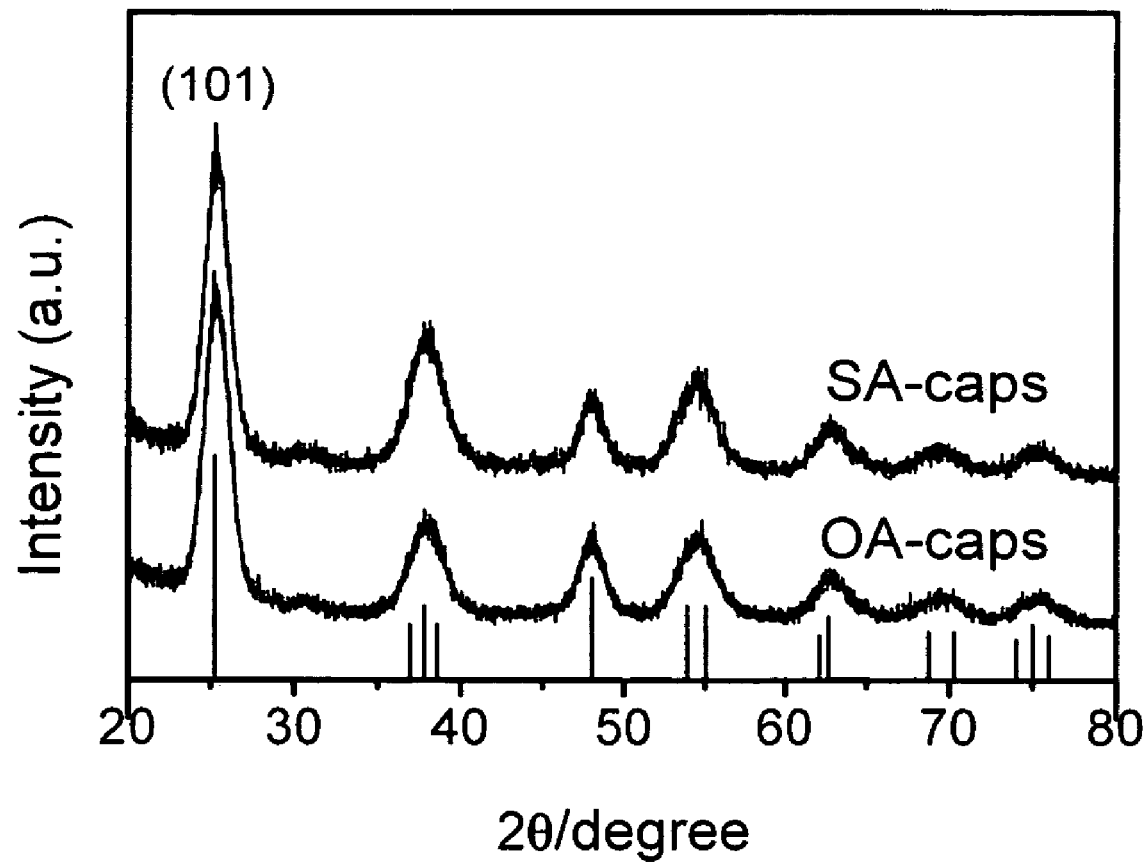
FIG. 4 is XRD powder patterns of stearic acid- and oleic acid-capped $TiO_2$ nanocrystals prepared in Examples 11 and 1.
Figure 5:
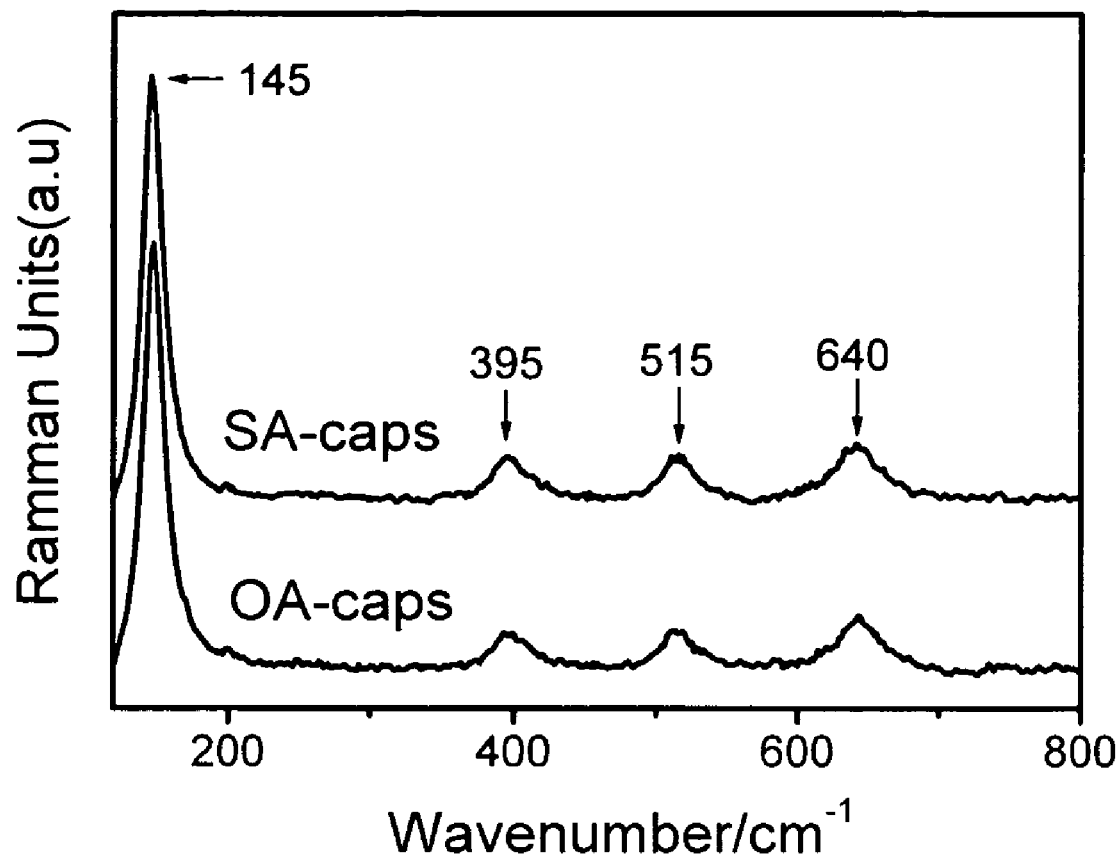
FIG. 5 is a graph showing Raman scattering spectrum of stearic acid-capped $TiO_2$ nanocrystals with an average diameter of 4.7 nm prepared in Example 11 and Raman scattering spectrum of oleic acid-capped TiO2 nanocrystals with an average diameter of 4.5 nm prepared in Example 1, respectively.

It can be confirmed by X-ray diffraction (XRD) powder patterns that the titanium dioxide nanocrystals samples prepared by the two-phase method have an anatase structure, and the size of crystallites was estimated from peak (101) thereof. FIG. 4 is XRD powder patterns of stearic acid- and oleic acid-capped $TiO_2$ nanocrystals prepared in Examples 11 and 1, respectively. The standard $TiO_2$ anatase diffraction lines indicate as vertical bars. The crystallite sizes calculated from the anatase (101) peak are 5.5 nm and 5.2 nm for stearic acid- and oleic acid-capped $TiO_2$ nanocrystals prepared in Examples 11 and 1, respectively. On the other hand, it can be confirmed by the characteristic peaks in Raman scattering spectra that the titanium dioxide samples have an anatase structure, which is consistent with the results of XRD. FIGS. 5A and 5B are Raman scattering spectra of stearic acid-capped titanium dioxide sample and oleic acid-capped titanium dioxide samples prepared in Example 11 and 1, respectively.

The prepared titanium dioxide nanocrystals can be dispersed stably in an organic non-polar solvent. After the titanium dioxide nanocrystals sample prepared in Example 11 has been placed for 6 months, the transmission electron microscope photograph thereof is shown in FIG. 6, and the average particle diameter thereof was 4.8 nm, which is substantially same as that in FIG. 2, indicating the prepared sample having superior stability for a long period of time.

What is claimed is:

1. A method for preparing organic ligand-capped titanium dioxide nanocrystals, wherein the method comprises the steps of:
   a) mixing a titanium source, an organic capping agent and an organic non-polar solvent to form a solution in an autoclave;
   b) adding an aqueous alkaline solution into the solution in the autoclave to form a mixture, and
   c) putting the autoclave containing said mixture into a furnace, keeping the temperature of the mixture at 120-280° C. for 2-24 hrs. thereby obtaining a transparent sol containing the titanium dioxide nanocrystals.

2. The method according to claim 1 wherein step c) is carried out at a high pressure up to 50 MPa in the autoclave.

3. The method according to claim 1 wherein the temperature in step c) is from 120° C. to 180° C.

* * * * *

UNITED STATES PATENT AND TRADEMARK OFFICE
CERTIFICATE OF CORRECTION

| | | |
|---|---|---|
| PATENT NO. | : 7,709,540 B2 | |
| APPLICATION NO. | : 11/293694 | |
| DATED | : May 4, 2010 | |
| INVENTOR(S) | : Pan et al. | |

It is certified that error appears in the above-identified patent and that said Letters Patent is hereby corrected as shown below:

On the title page (item 73) Assignee at line 2, Change "Chines" to --Chinese--.

In column 8, at line 15, In Claim 1, change "hrs." to --hrs.,--.

Signed and Sealed this
Twenty-fourth Day of May, 2011

David J. Kappos
*Director of the United States Patent and Trademark Office*